United States Patent [19]
Patel

[11] Patent Number: 5,350,954
[45] Date of Patent: Sep. 27, 1994

[54] MACROCELL WITH FLEXIBLE PRODUCT TERM ALLOCATION

[75] Inventor: Rakesh H. Patel, Santa Clara, Calif.

[73] Assignee: Altera Corporation, San Jose, Calif.

[21] Appl. No.: 39,927

[22] Filed: Mar. 29, 1993

[51] Int. Cl.$^5$ .......................................... H03K 19/177
[52] U.S. Cl. .................................. 307/465; 307/243; 307/465.1
[58] Field of Search ................. 307/443, 243, 465–469

[56] References Cited

U.S. PATENT DOCUMENTS

| | | | |
|---|---|---|---|
| 4,758,746 | 7/1988 | Birkner et al. | 307/465 |
| 4,864,161 | 9/1989 | Norman et al. | 307/272.2 |
| 4,871,930 | 10/1989 | Wong et al. | 307/465 |
| 4,879,481 | 11/1989 | Pathak et al. | 307/465 |
| 4,903,223 | 2/1990 | Norman et al. | 364/716 |
| 4,912,345 | 3/1990 | Steele et al. | 307/465 |
| 4,918,641 | 4/1990 | Jigour et al. | 364/716 |
| 4,983,959 | 1/1991 | Breuninger | 340/825.83 |
| 5,003,202 | 3/1991 | Keida | 307/465 |
| 5,023,484 | 6/1991 | Pathak et al. | 307/465 |
| 5,023,606 | 6/1991 | Kaplinksy | 340/825.8 |
| 5,027,011 | 6/1991 | Steele | 307/465 |
| 5,053,646 | 10/1991 | Higuchi et al. | 307/465 |
| 5,121,006 | 6/1992 | Pedersen | 307/465 |
| 5,220,214 | 6/1992 | Pedersen | |
| 5,225,719 | 7/1993 | Agrawal et al. | 307/465 |

OTHER PUBLICATIONS

Altera Max EPLD Family Architecture data sheet, Altera Corporation, Jan. 1990, pp. 1–5.
Advanced Micro Devices MACH 1 and MACH 2 Families data sheet, Advanced Micro Devices, Inc., Apr. 1991, pp. 1–7, 14, 15, 28 and 29.
Plus Logic FPGA2020 data sheet, Plus Logic, Inc., date unknown, pp. 1–7.

*Primary Examiner*—David R. Hudspeth
*Attorney, Agent, or Firm*—Robert R. Jackson; G. Victor Treyz

[57] ABSTRACT

An improved macrocell is provided for summing product term inputs to complete a sum of products. Some or all of a macrocell's product terms can be allocated to another macrocell. The macrocell OR function remains available to sum product term inputs, even when other product term inputs in the same macrocell are allocated elsewhere. Macrocells can also by daisy-chained bidirectionally, so that the delay associated with allocating product terms between multiple macrocells can be reduced.

46 Claims, 3 Drawing Sheets

MACROCELL WITH FLEXIBLE PRODUCT TERM ALLOCATION

BACKGROUND OF THE IVNENTION

This invention relates to programmable logic devices, and more particularly to improved macrocells in which the macrocell OR function can be retained during product term allocation and in which product terms can be allocated bidirectionally.

Programmable logic devices, which are capable of being programmed by a user to perform a variety of logic functions, are well known. These devices often are based on a programmable AND array coupled to an OR array. The outputs of the AND array are the logical product of the inputs to the array and are therefore called product terms. The OR logic sums the product terms so that together the two arrays form a complete "sum of products," which can be configured to provide any desired combinatorial logic function. (The outputs of the first array are called product terms regardless of whether the logic array is implemented using the AND-OR configuration or whether another of the equivalent two-level logic configurations is used.)

In some programmable logic devices it is advantageous to partition the OR logic into blocks called macrocells. The macrocells are each connected to a subset of the product terms of the AND array, which, although resulting in some loss of flexibility, generally allows resources to be used more efficiently. Each macrocell typically receives a set number of product terms which can then be summed by the OR logic and, if desired, processed further by additional macrocell logic and temporarily stored in a register within the macrocell. However, because the number of product terms per macrocell is fixed, logic functions that require more product terms cannot be implemented using this approach.

The limitations imposed by having a fixed number of product terms for each macrocell may be overcome by providing circuitry that allows the product term for one macrocell to be allocated to an adjacent macrocell, as shown in commonly-assigned U.S. Pat. No. 5,121,006. For example, if the macrocells in a programmable logic device each contain five product term inputs and in one macrocell six product terms must be summed, the sixth product term can be obtained from a neighboring macrocell. Similarly, if 15 product terms must be summed, three macrocells can be daisychained together.

However, when using the product term allocation scheme described in the above-mentioned U.S. Pat. No. 5,121,006, if only one additional product term input is required, the OR function of the macrocell from which the additional product term is allocated cannot be used for summing the remaining product term inputs in that macrocell. Further, when many macrocells are daisy-chained together, the fixed delay associated with each connection between macrocells may result in an overall delay that is too long. It would therefore be desireable if the magnitude of the cumulative delay could be reduced.

SUMMARY OF THE INENTION

These and other objects of the invention are accomplished in accordance with the principles of the invention by providing macrocells that have additional logic circuitry so that a macrocell's OR function is retained, even if some of the product terms in that macrocell are allocated to another macrocell. Further, the cumulative delay that arises when several macrocells are daisy-chained together can be reduced, because the macrocells of the present invention permit bidirectional product term allocation. By allocating product term inputs to a central macrocell from both directions along the chain, the longest path through the macrocells is effectively reduced to one half of the path length necessary with a unidirectional allocation scheme. As a result, the delay due to daisy-chaining the macrocells is also cut in half.

DETAILED DESCRIPTION OF THE PREFERRED EMBODIMENTS

Figure 1:
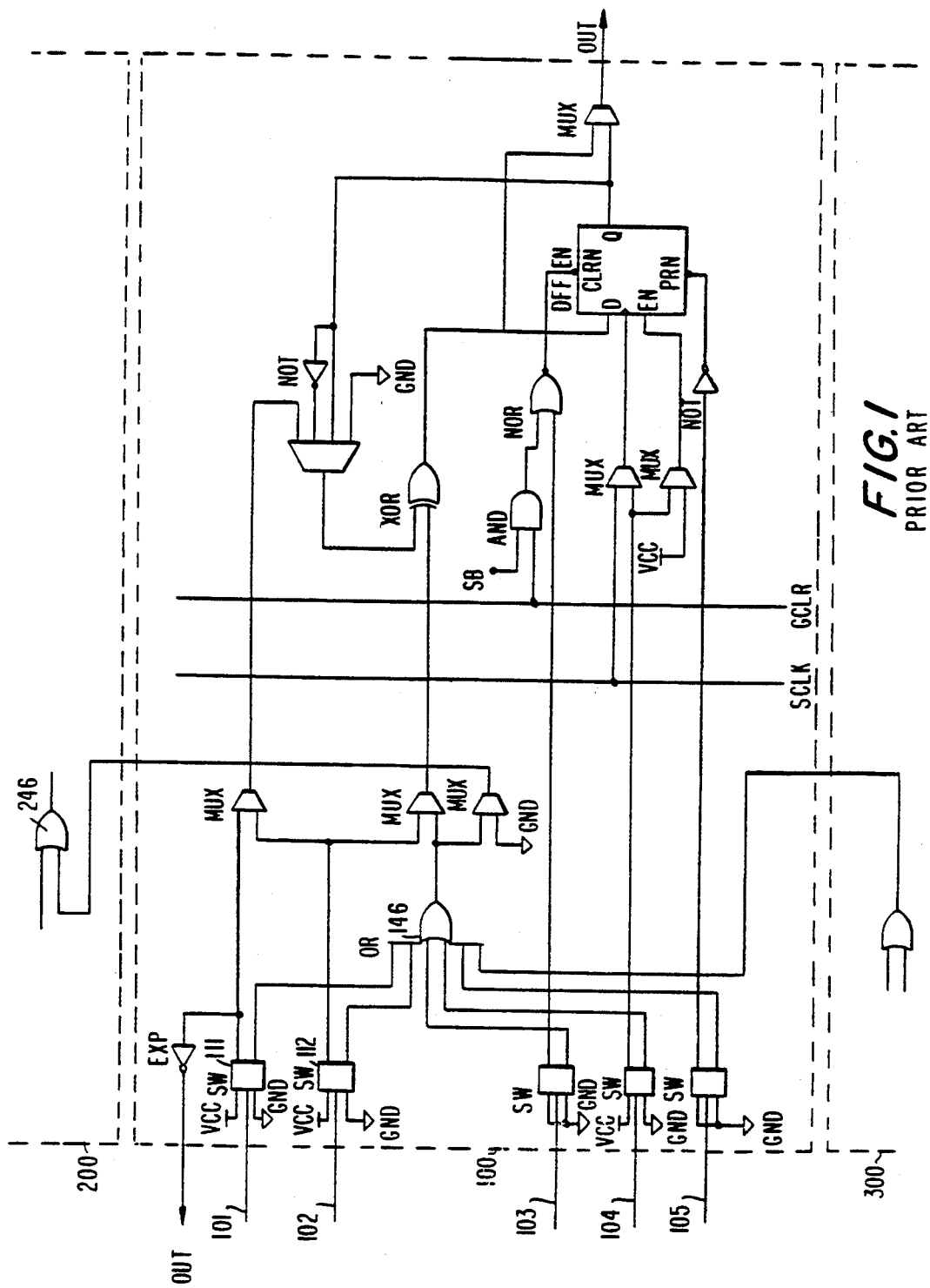
FIG. 1 is a schematic diagram of a macrocell with product term allocation, as shown in U.S. Pat. No. 5,121,006.

A macrocell that supports product term allocation is described in the above-mentioned commonly-assigned U.S. Pat. No. 5,121,006, which is incorporated herein by reference. The macrocell of that patent has five product term inputs, as shown in FIG. 1. Product terms 101, 102, 103, 104, and 105 are received from the AND array and summed by OR gate 146. If it is desired to increase the number of product terms that are summed in a macrocell, product terms are allocated from an adjacent macrocell. For instance, if macrocell 200 requires two additional product terms, they can be supplied by allocating product terms 101 and 102 from macrocell 100. This is accomplished by programming switches 111 and 112 such that product terms 101 and 102 are passed to the input of OR gate 146. The output signal from gate 146, which is the sum of the two product terms, is directed to the input of OR gate 246 in macrocell 200, which in turn sums this signal with the product terms of macrocell 200. It is immaterial in this scheme whether or not the two product terms from macrocell 100 are summed before they are directed to macrocell 200, or whether these two signals are individually connected to the input of OR gate 246, because both approaches yield the same logical result.

Although product terms may be effectively shared between macrocells with the macrocell shown in FIG. 1, product terms 103, 104, and 105, which were not allocated to macrocell 200, cannot be summed by OR gate 146, and therefore can not contribute to the sum of products implementation of the desired combinatorial logic function. Further, the macrocell shown in FIG. 1 uses a unidirectional allocation scheme. Thus, if it is desired to sum all of the product terms of macrocells 100, 200, and 300, the macrocells are daisy-chained together, one after another. The sum of the product terms of macrocell 300 are initially passed to OR gate 146 of macrocell 100, where this signal is summed with the product terms of macrocell 100. Following the calculation of this sum, the output signal of OR gate 146 is passed to the input of OR gate 246, where the final sum of products is calculated. With this approach, the finite delay associated with the calculation of the sum by each macrocell adds to the next. In contrast, in accordance with the present invention, the cumulative delay can be reduced by using bidirectional product term sharing, because a central macrocell can receive product terms from either direction, thereby effectively cutting the length of the longest chain of macrocells in half.

Figure 2:
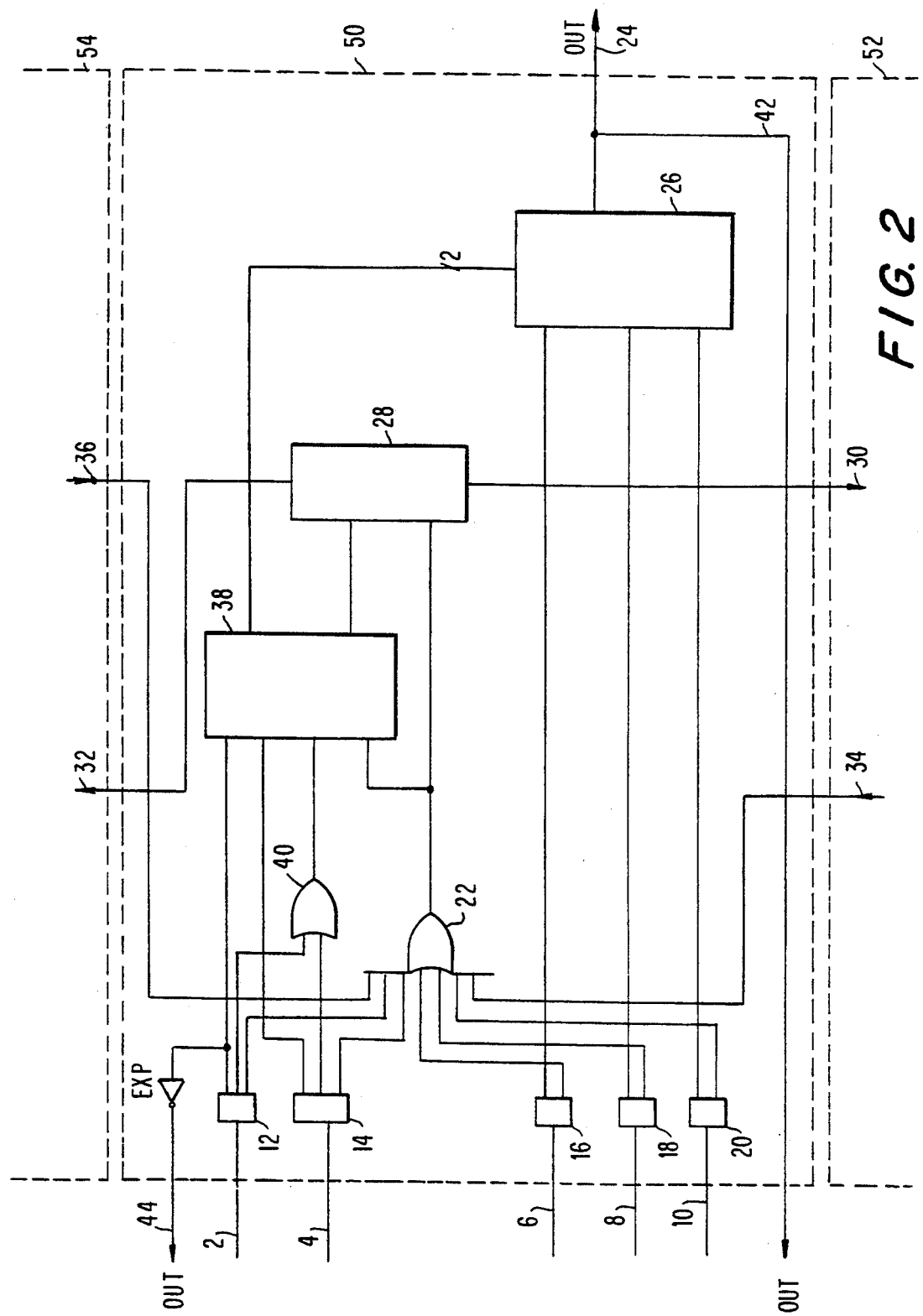
FIG. 2 is a schematic diagram of an illustrative macrocell constructed in accordance with the present invention.

An illustrative embodiment of a macrocell constructed in accordance with the present invention is shown in FIG. 2. Macrocell 50 has five product term inputs and OR logic to complete a sum of products. It will generally be desired to provide macrocell 50 with a register and additional logic circuitry so that macrocell 50 can function as a JK flip-flop, a toggle flip-flop, an SR flip-flop, or a D flip-flop. The ability to bypass the register is also a useful feature to include, as is the ability to selectively invert the output signal. Although these are some of the most beneficial features to include in macrocell 50, it will be appreciated that the present invention is not limited to macrocells incorporating any particular set of register-related logic features.

In macrocell 50, product terms 2, 4, 6, 8, and 10 are received by programmable switches 12, 14, 16, 18, and 20, respectively. The switches can be programmed so that the product terms bypass OR gate 22 and are passed on through macrocell 50 to register logic 26. Alternatively, the programmable switches can be set to direct the product terms to OR gate 22 to be summed. When programmable switches direct the product terms to selected switch outputs, the other outputs of the programmable switches are taken to either a logic high or logic low, as required. For example, if programmable switch 16 directs product term 6 to register logic 26, a logic low is applied to OR gate 22, so that the functional operation of OR gate 22 is retained with respect to the remaining product terms.

If it is desired to share product terms, allocation logic 28 can allocate product terms to macrocell 52 via output 30 or to macrocell 54 via output 32. Macrocell 50 can receive product terms from macrocell 52 via input 34 or from macrocell 54 via input 36. Bidirectional allocation to a central macrocell reduces the cumulative propagation delay through the circuit due to daisy-chaining multiple macrocells, because the longest signal path through the macrocells is shortened.

If it is desired to allocate a single product term to an adjacent cell, product term 2 can be connected to switch logic 38 by programmable switch 12 and OR gate 40. Switch logic 38 directs product term 2 to allocation logic 28, which passes product term 2 to either macrocell 52 or macrocell 54, as desired. Programmable switch 12 also applies a logic low to the input of OR gate 22. In contrast to the macrocell shown in FIG. 1, macrocell 50 retains the capability to sum the remaining product terms 4, 6, 8, and 10 with OR gate 22. Programmable switches 14, 16, 18, and 20 can be programmed to connect the product terms 4, 6, 8, and 10 to OR gate 22, even though product term 2 is allocated to another macrocell. The output of OR gate 22 is directed to register logic 26 by switch logic 38.

Macrocell 50 can also complete a sum of products when two product terms are allocated to an adjacent macrocell. Product terms 2 and 4 can be connected to OR gate 40 by programmable switches 12 and 14. OR gate 40 sums product terms 2 and 4 and passes the result to switch logic 38. Allocation logic 28 receives this signal and allocates the product terms to one of the adjacent macrocells. Because OR gate 40 operates separately from OR gate 22, the remaining product terms, product terms 6, 8, and 10, can continue to be summed by OR gate 22. Switch logic 38 connects the output of OR gate 22 to register logic 26.

To allocate three product terms while retaining the OR function of macrocell 50, programmable switches 16, 18, and 20 connect product terms 6, 8, and 10 to OR gate 22. The output of OR gate 22 is directed to an adjacent macrocell by allocation logic 28. Product terms 2 and 4, which remain dedicated to macrocell 50, are summed by OR gate 40. The output of OR gate 40 is directed to register logic 26 by switch logic 38.

It is also possible to allocate four or five product terms to an adjacent macrocell. To allocate four product terms, product terms 4, 6, 8, and 10 are connected to OR gate 22 by programming switches 14, 16, 18, and 20. The output of OR gate 22 is provided to macrocell 52 or macrocell 54 by allocation logic 28. Programmable switch 12 directs product term 2 to switch logic 38, which can connect product term 2 to register logic 26. To allocate five product terms, all product terms are summed by OR gate 22 and subsequently passed to an adjacent macrocell by allocation logic 28. Multiple macrocells can be daisy-chained together by allocating all of the available product terms in each macrocell to the next adjacent macrocell.

In a logic design that uses multiple macrocells, it may not be necessary to use the OR function that has been retained. In that case, one of many alternative configurations can be used. For example, when allocating product terms 6, 8, and 10 to an adjacent macrocell, product term 2 can be fed back to an AND array via expander connection 44 while product term 4 is connected to register logic 26. Product terms 2 and 4 can also both be directed to register logic 26. If desired, product terms 2 and 4 could be shared with, for example, macrocell 54, while product terms 6, 8, and 10 are used to control register logic 26.

Each macrocell 50 has feedback connection 42, which is connected to an input of the AND array to provide a rapid local feedback path for the output signal at output terminal 24. This feature is especially useful for implementing those logic designs which rely heavily on macrocell feedback - for example, counters. Another type of macrocell feedback is provided by expander connection 44, which is also connected to the input of the AND array. Expander connection 44 differs from feedback connection 42 in that the expander feedback is derived from an earlier stage in the macrocell. If, in a particular macrocell, expander connection 44 has already been committed, feedback connection 42 can be used as a substitute expander-type connection for feeding back an additional product term.

Figure 3:
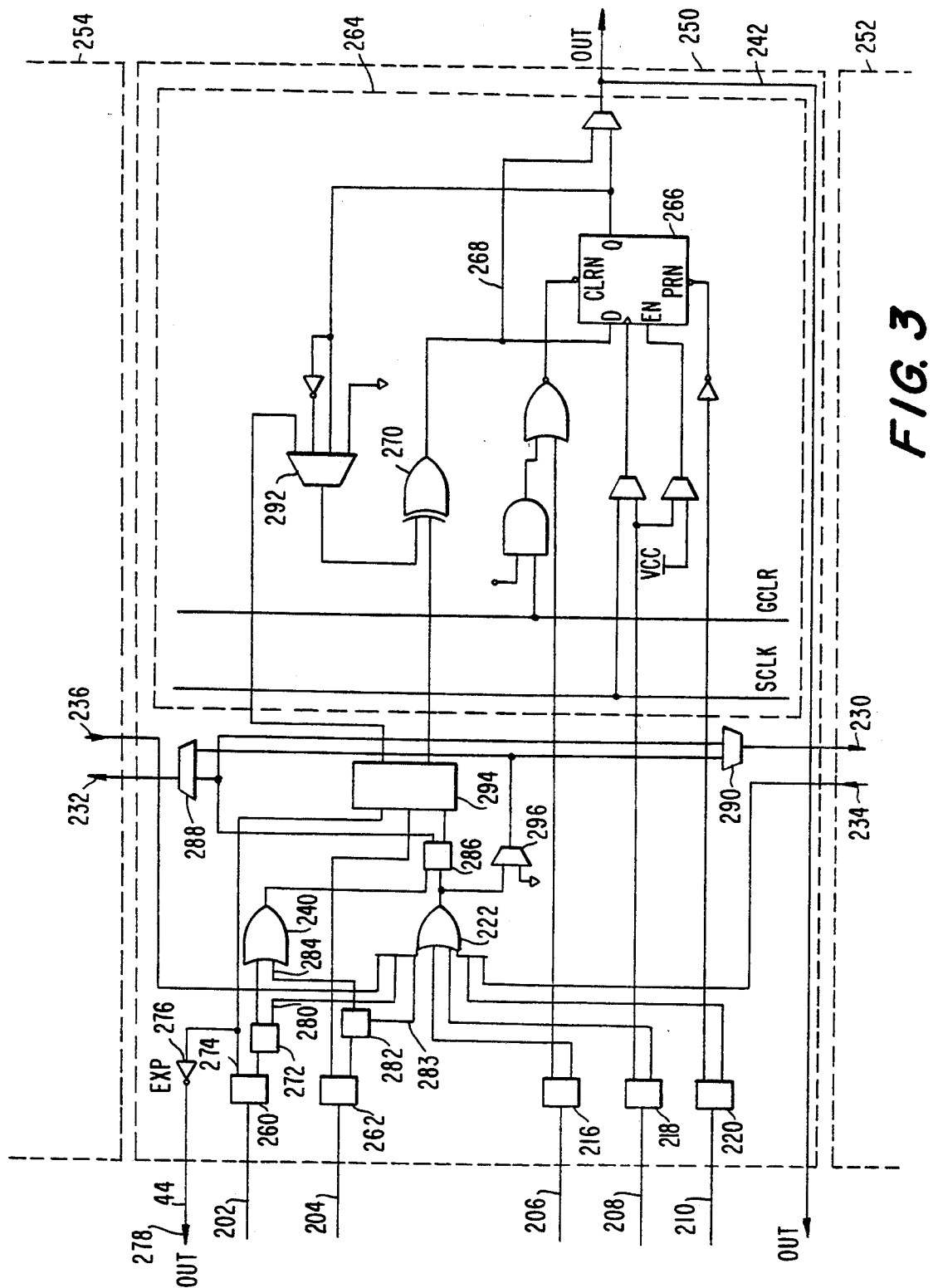
FIG. 3 is a schematic diagram of a preferred embodiment of an illustrative macrocell constructed in accordance with the present invention.

A preferred illustrative embodiment of the present invention is shown in FIG. 3. Macrocell 250 receives product terms 202, 204, 206, 208, and 210 via programmable switches 260, 262, 216, 218, and 220. Register logic 264 can provide the functionality of a JK flip-flop, a toggle flip-flop, an SR flip-flop, or a D flip-flop, as described in the above-identified U.S. Pat. No. 5,121,006. Register logic 264 can be controlled by global input lines and by product terms 206, 208, and 210. If desired, flip-flop 266 can be bypassed via connection 268. Register logic 264 also contains XOR gate 270, which allows the output to be selectively inverted.

In order to allocate a product term to an adjacent macrocell, programmable switch 260 directs product term 202 to programmable switch 272 and applies a logic high at output terminal 274, which is inverted by inverter 276 to produce a logic low at output terminal 278. Programmable switch 272 switches product term 202 to OR gate 240 and applies a logic low to OR gate 222 via output 280, so that the logic function of OR gate 222 is unchanged with respect to the remaining product terms. Programmable switch 262 directs product term 204 to programmable switch 282, which passes product term 204 to OR gate 222 and applies a logic low to input terminal 284 of OR gate 240, which allows product term 202 to pass to programmable switch 286.

Programmable switch 286 directs product term 202 to multiplexers 288 and 290, one of which is enabled to allow product term 202 to be supplied to the desired macrocell. The sum of product terms 204, 206, 208, and 210, which is the output of OR gate 222, is provided to multiplexer 292 and XOR gate 270 of register logic 264 by programmable switches 286 and 294.

The settings of programmable switches 260, 262, and 272 are the same when two product terms are to be shared with another macrocell rather than one. However, when two are shared, programmable switch 282 directs product term 204 to OR gate 240 and applies a logical low at output 283, so that the logic function of OR gate 222 is unchanged with respect to the remaining product terms. The sum of product terms 202 and 204, which is the output of OR gate 240, is directed by programmable switch 286 to multiplexers 288 and 290. Depending on which of the two multiplexers is enabled, product terms 202 and 204 will be provided to either macrocell 252 or 254. As in the case where only one product term is shared, the sum of product terms 206, 208, and 210 is provided to register logic 264 by programmable switches 286 and 294.

If allocating three product terms, programmable switches 216, 218, and 220 are set to switch product terms 206, 208, and 210 to OR gate 222. The sum of these product terms is received by multiplexer 296 and directed to multiplexers 288 and 290, which allocate the product terms to either macrocell 252 or 254. Product terms 202 and 204 can be summed by OR gate 240 by setting programmable switch 260 to direct product term 202 to programmable switch 272, which passes product term 202 to OR gate 240 and applies a logic low to OR gate 222 so that the sum of product terms 206, 208, and 210 is unaffected. Programmable switch 262 directs product term 204 to programmable switch 282, which passes this product term to OR gate 240 and also applies a logic low to OR gate 222 so that the sum of the remaining product terms is unaffected. The sum of product terms 202 and 204 may be connected to register logic 264 by programmable switch 286. Alternatively, product terms 202 and 204 could be shared with, for example, macrocell 254, while product terms 206, 208, and 210 are shared with macrocell 252, by setting programmable switch 286 to provide the sum of product terms 202 and 204 to multiplexer 288. Multiplexer 288 can direct product terms 202 and 204 to macrocell 254 while multiplexer 290 provides the remaining product terms to macrocell 252.

If it is desired to allocate four product terms to another macrocell, product terms 204, 206, 208, and 210 are first summed by OR gate 222. Programmable switches 216, 218, and 220 direct product terms 206, 208, and 210 to OR gate 222. Programmable switch 262 connects product term 204 to programmable switch 282, which directs that product term to OR gate 222 and applies a logic low to OR gate 240. The output of OR gate 222 is applied to multiplexers 288 and 290 by multiplexer 296. Product terms 204, 206, 208, and 210 are shared with either macrocell 252 or 254, depending on the chosen settings of multiplexers 288 and 290. Programmable switch 260 can be set to direct product term 202 to register logic 264 via programmable switch 294. Alternatively, product term 202 can be fed back to the AND array via expander output terminal 278. To share five product terms with another macrocell, the sum of all five product terms is directed from the output of OR gate 222 to multiplexers 288 and 290 by programming multiplexer 296.

It will be understood that the foregoing is merely illustrative of the principles of this invention, and that various modifications can be made by those skilled in the art without departing from the scope and spirit of the invention. For example, the number of product terms provided in each macrocell can be varied. The type and complexity of the register logic that is provided can also be changed.

The invention claimed is:

1. Programmable logic array apparatus comprising a plurality of macrocells each of which receives a finite number of multiple input signals, each macrocell comprising:

a first logic gate for producing a first logical function of a first number of the input signals, the first number being from zero to the finite number;

a second logic gate for producing a second logical function of a second number of the input signals, the second number being from zero to the finite number, such that the first number added to the second number is finite number; and allocation logic for receiving the first logical function of the first number of input signals from the first logic gate and allocating the first logical function of the first number of input signals to another macrocell, wherein when the first logical function of a first macrocell is allocated to a second macrocell, the first logic gate of the second macrocell receives the first logical function of the first macrocell the second logical function of the first macrocell is retained by the first macrocell.

2. The apparatus defined in claim 1 further comprising:

register logic capable of storing a selected one of (a) the first logical function of the first number of input signals, and (b) the second logical function of the second number of input signals.

3. The apparatus defined in claim 2 further comprising:

a local feedback connection that is connected to the register logic.

4. The apparatus defined in claim 1 wherein the input signals are product terms.

5. The apparatus defined in claim 1 wherein the first logic gate is an OR gate for summing the first number of input signals, the first logical function being the sum of the first number of input signals.

6. The apparatus defined in claim 1 wherein the second logic gate is an OR gate for summing the second number of input signals, the second logical function being the sum of the second number of input signals.

7. The apparatus defined in claim 1 wherein the allocation logic comprises:

means for allocating the first logical function to a first additional macrocell; and means for allocating the first logical function to a second additional macrocell, the second additional macrocell being distinct from the first additional macrocell.

8. A macrocell that receives a plurality of input signals, comprising:
a first logic gate for producing a first function of a first number of the input signals;
a second logic gate for producing a second logical function of a second number of the input signals; and
allocation logic for receiving the function of the first number of input signals from logic gate and allocating the first logical function of the first number of input signals to another macrocell, wherein the allocation logic comprises:
a first multiplexer for receiving the first logical function of the first number of input signals, the first multiplexer being connected to the first additional macrocell for directing a selected one of (a) a logic low and (b) the first logical function of the first number of input signals to a first additional macrocell; and
a second multiplexer for receiving the first, logical function of the first number of input signals, the second multiplexer being connected to the second additional macrocell for directing a selected one of (a) a logic low and (b) the first logical function of the first number of input. signals to a second additional macrocell.

9. A macrocell that receives a plurality of input signals, comprising:
a first logic gate for producing a first logical function of a first number of the input signals;
a second logic gate for producing a second logical function of a second number of the input signals;
allocation logic for receiving the first logical function of the first number of input signals from the first logic gate and allocating the first logical function of the first number of input signals to another macrocell:
means for selectively directing the first number of input signals to the first logic gate; and
means for selectively directing the second number of input signals to the second logic gate, the second number of input signals and the first number of signals being mutually exclusive.

10. Programmable logic array apparatus comprising a plurality of macrocells, each macrocell receiving a finite number of multiple input signals, the apparatus comprising:
a first macrocell, comprising:
a first logic gate for providing a first logical function of a first number of input signals, the first number being from zero to the finite number;
means for allocating the first number of input signals to a second macrocell distinct from the first macrocell; and
means for allocating the first number of input signals to a third macrocell, the third macrocell being distinct from the first and second macrocells.

11. The apparatus defined in claim 10 further comprising:
register logic capable of storing a selected one of (a) the first logical function of the first number of input signals and (b) the second logical function of the second number of input signals.

12. The apparatus defined in claim 11 further comprising:
a local feedback connection that is connected to the register logic.

13. The apparatus defined in claim 10 further comprising:
a second logic gate for providing a second logical function of a second number of input signals.

14. The apparatus defined in claim 13 wherein the second logic gate is an OR gate for summing the second number of input signals, the second logical function being the sum of the second number of input signals.

15. The apparatus defined in claim 10 wherein the input signals are product terms.

16. The apparatus defined in claim 10 wherein the first logic gate is an OR gate for summing the first number of input signals, the first logical function being the sum of the first number of input signals.

17. A macrocell for receiving a plurality of input signals, comprising:
a first logic gate for providing a first logical function of a first number of input signals;
means for allocating the first number of input signals to a first additional macrocell; and
means for allocating the first number of input signals to a second additional macrocell, the second additional macrocell being distinct from the first additional macrocell, wherein the means for allocating the first number of input signals to the first additional macrocell comprises:
a first multiplexer for receiving the first number of input signals, the first multiplexer being connected to the first additional macrocell for directing a selected one of (a) a logic low and (b) the first number of input signals to the first additional macrocell.

18. The macrocell defined in claim 17 wherein the means for allocating the first number of product terms to the second additional macrocell comprises:
a second multiplexer for receiving the first number of input signals, the second multiplexer being connected to the second additional macrocell for directing a selected one of (a) a logic low and (b) the first number of input signals to the second additional macrocell.

19. A macrocell for receiving a plurality of input signals, comprising:
a first logic gate for providing a first logical function of a first number of input signals;
means for allocating the first number of input signals to a first additional macrocell;
means for allocating the first number of input signals to a second additional macrocell, the second additional macrocell being distinct from the first additional macrocell;
means for selectively directing the first number of input signals to the first logic gate; and
means for selectively directing the second number of input signals to the second logic gate, the second number of input signals and the first number of input signals being mutually exclusive.

20. A method of allocating product terms between macrocells comprising the steps of:
providing a first logical function of a first number of input signals with a first logic gate;
providing a second logical function of a second number of input signals with a second logic gate;

allocating the first number of input signals to a first macrocell; and allocating the first number of input signals to a second macrocell, the second macrocell being distinct from the first macrocell, wherein the step of allocating the first number of input signals to the first macrocell further comprises the steps of:

receiving the first number of input signals with a first multiplexer that is connected to the first macrocell; and directing through the first multiplexer a selected one of (a) a logic low and (b) the first number of input signals to the first macrocell.

21. The method defined in claim 20 wherein the step for allocating the first number of input signals to the second macrocell further comprises the steps of:

receiving the first number of input signals with a second multiplexer that is connected to the second macrocell; and directing through the second multiplexer a selected one of (a) a logic low and (b) the first number of input signals to the second macrocell.

22. The method defined in claim 20 further comprising the step of:

storing a selected one of (a) the first logical function of the first number of input signals and (b) the second logical function of the second number of logical functions with register logic.

23. The method defined in claim 20 further comprising the step of:

providing a local feedback connection that is connected to the register logic.

24. The method defined in claim 20 wherein the step of providing the first logical function comprises the step of:

summing the first input signals with the first logic gate, the first logic gate being an OR gate.

25. The method defined in claim 20 wherein the step of providing the second logical function comprises the step of:

summing the second input signals with the second logic gate, the second logic gate being an OR gate.

26. The method defined in claim 20 wherein the input signals are product terms.

27. The method of claim 20 further comprising the steps of:

selectively directing the second number of input signals to the first logic gate; and selectively directing the second number of input signals to the second logic gate, the second number of input signals and the first number of input signals being mutually exclusive.

28. A method of allocating input signals between macrocells comprising the steps of:

providing a first logical function of a first number of input signals with a first logic gate;

allocating the first number of signals to a first macrocell;

allocating the first number of input signals to a second macrocell, the second macrocell being distinct from the first macrocell;

selectively directing the first number of input signals to the first logic gate; and selectively directing the second number of input signals to the second logic gate, the second number of input signals and the first number of input signals being mutually exclusive.

29. The method defined in claim 28 further comprising the steps of:

providing a second logical function of a second number of inputs with a second logic gate.

30. The method defined in claim 29 wherein the step of providing the second logical function comprises the step of:

summing the second input signals with the second logic gate, the second logic gate being an OR gate.

31. The method defined in claim 28 further comprising the step of:

receiving the second number of inputs with register logic.

32. The method defined in claim 31 further comprising the step of:

providing a local feedback connection that is connected to the register logic.

33. The method defined in claim 28 wherein the step of allocating the first number of input signals to the first macrocell further comprises the steps of:

receiving the first number of input signals with a first multiplexer that is connected to the first macrocell; and directing through the first multiplexer a selected one of (a) a logic low and (b) the first number of input signals to the first macrocell.

34. The method defined in claim 33 wherein the step of allocating the first number of input signals to the second macrocell further comprises the steps of:

receiving the first number of input signals with a second multiplexer that is connected to the second macrocell; and directing through the second multiplexer a selected one of (a) a logic low and (b) the first number of input signals to the second macrocell.

35. The method defined in claim 28 wherein the step of providing the first logical function comprises the step of:

summing the first input signals with the first logic gate, the first logic gate being an OR gate.

36. Programmable logic array apparatus comprising:

a plurality of macrocells, each of which includes (a) a plurality of first means, each of which is capable of producing an associated intermediate output signal which is an associated selected logical function of a plurality of input signals, and (b) second means capable of producing a final output signal which is a selected logical function of said intermediate output signals, the second means of at least one of said macrocells further including:

third means capable of producing a further intermediate output signal which is a selected logical function of at least some of said intermediate output signals; and fourth means for selectively applying either said final output signal or said further intermediate output signal to the second means of at least one other macrocell for use by the second means of that other macrocell as an intermediate output signal.

37. The apparatus defined in claim 36 wherein said fourth means comprises:

fifth means for selectively applying either said final output signal or said further intermediate output signal to the second means of a first other macrocell for use by the second means of said first other macrocell as an intermediate output signal; and sixth means for selectively applying either said final output signal or said further intermediate output signal to the second means of a second other macrocell for use by the second means of said second other macrocell as an intermediate output signal.

38. The apparatus defined in claim 36 wherein said second means of said one of said macrocells comprises first logic circuitry capable of receiving substantially all of said intermediate output signals and for producing said final output signal from the intermediate output signals received by said first logic circuitry, and wherein said third means comprises second logic circuitry capable of receiving substantially less than all of said intermediate output signals and for producing said further intermediate output signal from the intermediate output signals received by said second logic circuitry.

39. The apparatus defined in claim 36 wherein, in addition to said one of said macrocells, the second means of at least one other of said macrocells includes third and fourth means similar to the third and fourth means of said one of said macrocells, wherein the fourth means of said one other of said macrocells selectively applies either the final output signal or the further intermediate output signal of said one other of said macrocells to the second means of said one of said macrocells, and wherein said second means of said one of said macrocells is capable of using said final output signal or said further intermediate output signal of said one other of said macrocells as an intermediate output signal.

40. The apparatus defined in claim 39 wherein, in addition to said one and said one other of said macrocells, the second means of a third of said macrocells includes third and fourth means similar to the third and fourth means of said one of said macrocells, wherein the fourth means of said third of said macrocells selectively applies either the final output signal or the further intermediate output signal of said third of said macrocells to the second means of said one of said macrocells, and wherein said second means of said one of said macrocells is capable of using said final output signal or said further intermediate output signal of said third of said macrocells as an intermediate output signal.

41. The apparatus defined in claim 40 wherein said one of said macrocells is disposed on said programmable logic array intermediate said one other and said third of said macrocells.

42. The apparatus defined in claim 36 wherein said one of said macrocells further comprises:
register means for selectively storing a signal applied to said register means as a data signal; and
switching means for directing a selected one of (a) said final output signal and (b) said further intermediate output signal to said register means as said data signal.

43. The apparatus defined in claim 36 wherein said one of said macrocells further comprises:
a macrocell output terminal; and
switching means for directing a selected one of (a) said final output signal and (b) said further intermediate output signal to said macrocell output terminal.

44. The apparatus defined in claim 36 wherein said one of said macrocells further comprises:
register means for selectively storing a signal applied to said register means as a data signal and for producing a register output signal indicative of the signal stored by said register;
a macrocell output terminal;
first switching means for applying either said final output signal or said further intermediate output signal to said register means as said data signal; and
second switching means for applying either said data signal or said register output signal to said macrocell output terminal.

45. The apparatus defined in claim 36 wherein said one of said macrocells further comprises:
register means for selectively storing a signal applied to said register means as a data signal; and
switching means for selectively applying one of (a) an intermediate output signal, (b) said final output signal, and (c) said further intermediate output signal to said register means as said data signal.

46. The apparatus defined in claim 45 wherein said register means produces a register output signal which is indicative of the signal stored by said register means, and wherein said one of said macrocells further comprises:
a macrocell output terminal; and
further switching means for selectively applying either said data signal or said register output signal to said macrocell output terminal.

* * * * *